US008487352B2

(12) United States Patent
Kim et al.

(10) Patent No.: US 8,487,352 B2
(45) Date of Patent: Jul. 16, 2013

(54) METAL OXIDE SEMICONDUCTOR (MOS) TRANSISTORS HAVING A RECESSED GATE ELECTRODE

(75) Inventors: Yong-Sung Kim, Gyeonggi-do (KR); Tae-Young Chung, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/236,389

(22) Filed: Sep. 19, 2011

(65) Prior Publication Data

US 2012/0007175 A1     Jan. 12, 2012

Related U.S. Application Data

(60) Continuation of application No. 12/683,089, filed on Jan. 6, 2010, now Pat. No. 8,039,876, which is a division of application No. 11/263,434, filed on Oct. 31, 2005, now Pat. No. 7,655,522.

(30) Foreign Application Priority Data

Nov. 2, 2004   (KR) .................. 10-2004-0088512

(51) Int. Cl.
  *H01L 27/148*   (2006.01)
(52) U.S. Cl.
  USPC .......................................... 257/240; 257/244
(58) Field of Classification Search
  USPC .................................... 257/240, 244
  See application file for complete search history.

(56) References Cited

U.S. PATENT DOCUMENTS

| 6,355,532 | B1 | 3/2002 | Seliskar et al. |
| 6,395,604 | B1 | 5/2002 | Kubo et al. |
| 6,436,765 | B1 | 8/2002 | Liou et al. |
| 6,498,071 | B2 | 12/2002 | Hijzen et al. |
| 2003/0235959 | A1* | 12/2003 | Lichtenberger et al. ...... 438/272 |
| 2004/0089892 | A1 | 5/2004 | Suzuki |
| 2005/0001266 | A1* | 1/2005 | Kim .............................. 257/330 |
| 2005/0042833 | A1* | 2/2005 | Park et al. ..................... 438/282 |
| 2005/0110071 | A1* | 5/2005 | Ema et al. ..................... 257/314 |
| 2005/0282343 | A1 | 12/2005 | Shin et al. |
| 2007/0075377 | A1 | 4/2007 | Huang et al. |

FOREIGN PATENT DOCUMENTS

| JP | 05-206459 | 8/1993 |
| KR | 1020000026238 A | 5/2000 |
| KR | 1020010014813 A | 2/2001 |
| KR | 10-2004-0016678 A | 2/2004 |

OTHER PUBLICATIONS

Korean Office Action issued in corresponding Korean Patent Application No. KR 10-2004-0088512 mailed Jan. 26, 2006.

* cited by examiner

*Primary Examiner* — Jae Lee
(74) *Attorney, Agent, or Firm* — Myers Bigel Sibley & Sajovec, P.A.

(57) ABSTRACT

A metal oxide semiconductor (MOS) includes an isolation layer disposed in a semiconductor substrate to define an active region. A source region and a drain region are disposed on both sides of the active region such that a first direction is defined from the source region to the drain region. A channel recess is disposed in the active region between the source and drain regions. The channel recess has a convex surface when viewed from a cross-sectional view taken along a second direction orthogonal to the first direction. A gate electrode fills the channel recess and crosses the active region in the second direction. A gate insulating layer is interposed between the gate electrode and the active region.

20 Claims, 8 Drawing Sheets

METAL OXIDE SEMICONDUCTOR (MOS) TRANSISTORS HAVING A RECESSED GATE ELECTRODE

CROSS-REFERENCE TO RELATED APPLICATION

The present application is a Continuation Application of U.S. patent application Ser. No. 12/683,089, filed in the United States Patent Office on Jan. 6, 2010, now U.S. Pat. No. 8,039,876 which is a Divisional Application of U.S. patent application Ser. No. 11/263,434, filed in the United States Patent Office on Oct. 31, 2005 (now U.S. Pat. No. 7,655,522), and claims the benefit of and priority to Korean Patent Application No. 2004-88512, filed Nov. 2, 2004, the disclosures of which are hereby incorporated herein by reference in their entirety.

BACKGROUND OF THE INVENTION

1. Field of the Invention

The present invention relates generally to semiconductor devices and methods of fabricating the same and, more particularly, to metal oxide semiconductor (MOS) field effect transistors (hereinafter referred to as MOS transistors) and methods of fabricating the same.

2. Description of Related Art

In general, semiconductor devices use discrete devices, such as MOS transistors as switching devices. With an increase in the degree of integration of semiconductor devices, the MOS transistor is being gradually scaled down. As a result, a MOS transistor with a typical horizontal channel may not operate normally due to a short channel effect (SCE) and a drain-induced barrier lowering (DIBL) effect, which may be caused by a short channel length between a source and a drain. Also, owing to increases in off current and swing, it may be difficult to effectively control the on/off operation of the MOS transistor.

To overcome the foregoing drawbacks of a MOS transistor with a horizontal channel, other MOS transistors having various structures have been proposed. One of the new MOS transistors is a double gate transistor, an example of which is described in U.S. Pat. No. 6,355,532. In the double gate transistor, a gate electrode surrounds two or three sides of a channel such that all of the regions of the channel are affected by the gate electrode. This may lead to reductions in swing and off current, which are subthreshold characteristics. As a result, when the MOS transistor is turned off, it may be possible to regulate the flow of electric charges between a source and a drain so that power dissipation can be reduced and the on/off operation of the MOS transistor can be effectively controlled.

In another approach to address the problems of a MOS transistor with a horizontal channel, there have been intensive studies on a MOS transistor having a recessed gate electrode called a "trench-gate transistor" (hereinafter a recess gate transistor) as another new MOS transistor. The recess gate transistor, an example of which is described in U.S. Pat. No. 6,498,071, includes a recess formed in an active region of a semiconductor substrate, a gate electrode formed in the recess, and source and drain regions that are formed in the active region on both sides of the gate electrode and spaced apart from each other by the recess. In spite of the relatively high degree of integration, such a recess gate transistor may suppress the influence of a short channel effect (SCE) and a drain-induced barrier lowering (DIBL) effect due to its increased channel length.

However, a recess of a conventional recess gate transistor, which is formed in an active region by etching a silicon substrate exposed by a mask pattern, typically has a flat or concave bottom profile in the direction of channel width. As a result, although the influence of the SCE and DIBL effect may be suppressed, there is a limit in improving a swing or off current characteristic with an increase in the capacitance of a depletion layer due to a gate voltage.

SUMMARY

According to some embodiments of the present invention, a metal oxide semiconductor (MOS) includes an isolation layer disposed in a semiconductor substrate to define an active region. A source region and a drain region are disposed on both sides of the active region such that a first direction is defined from the source region to the drain region. A channel recess is disposed in the active region between the source and drain regions. The channel recess has a convex surface when viewed from a cross-sectional view taken along a second direction orthogonal to the first direction. A gate electrode fills the channel recess and crosses the active region in the second direction. A gate insulating layer is interposed between the gate electrode and the active region.

In other embodiments, the MOS transistor may further include a channel in the semiconductor substrate along the channel recess that electrically connects the source and drain regions.

In still other embodiments, when viewed from the cross-sectional view taken along the second direction, the channel recess may have a first depth, which is measured at both ends of the active region, and a second depth, which is measured at the center of the active region and is shallower than the first depth.

In still other embodiments, the projection height of the channel recess surface that corresponds to a difference between the first and second depths may be about ¼ to ½ times the width of the active region taken along the second direction.

In still other embodiments, each of the first and second depths may have a minimum value at both ends of the channel recess taken along the first direction and have a maximum value at about the center of the channel recess taken along the first direction.

In still other embodiments, when viewed from a cross-sectional view taken along the first direction, the channel recess may have a shape substantially corresponding to the letter "U." In this case, the semiconductor surface of the channel recess may have a 3-dimensional saddle shape.

In further embodiments of the present invention, a MOS transistor is formed by forming an isolation layer in a semiconductor substrate to define an active region. A buffer layer pattern is formed such that it exposes the edge regions of the active region and covers the central region of the active region along a first side of the active region and a second side opposite to the first side when viewed from a plan view. A first direction defined as being parallel to the first and second sides. A mask pattern is formed on the semiconductor substrate having the buffer layer pattern. The mask pattern has an opening that exposes a predetermined region of the buffer layer pattern on the active region and the edge regions of the active region on both sides of the predetermined region of the buffer layer pattern. A channel recess is formed in the active region by etching the buffer layer pattern and the active region using the mask pattern as an etch mask. The channel recess has a convex surface when viewed from a cross-sectional view taken along a second direction that is orthogonal to the first direction.

In still further embodiments, when viewed from the cross-sectional view taken along the second direction, the channel recess may have a first depth, which is measured at both ends of the active region, and a second depth, which is measured at the center of the active region and is shallower than the first depth.

In still further embodiments, when viewed from a cross-sectional view taken along the first direction, the channel recess may have a shape substantially corresponding to the letter "U." In this case, the semiconductor surface of the channel recess may have a 3-dimensional saddle shape.

In still further embodiments, forming the buffer layer pattern may include forming a buffer material layer on the surface of the semiconductor substrate having the isolation layer and patterning the buffer material layer.

In still further embodiments, the buffer layer pattern may comprise a silicon oxide layer, a silicon nitride layer, a silicon oxynitride layer, and/or a polysilicon layer.

In still further embodiments, the buffer layer pattern may be formed such that it is spaced about the same distance apart from both the first and second sides of the active region.

In still further embodiments, the buffer layer pattern may be formed to a thickness of about 100 Å or less.

In still further embodiments, etching the buffer layer pattern and the active region may include simultaneously etching a portion of the buffer layer pattern exposed by the mask pattern and the edge regions of the active region, which are exposed by the mask pattern and the buffer layer pattern, and simultaneously etching the edge regions and the central region of the active region after the portion of the buffer layer pattern is removed.

BRIEF DESCRIPTION OF THE DRAWINGS

The foregoing and other objects, features and advantages of the invention will be apparent from the more particular description of exemplary embodiments of the invention, as illustrated in the accompanying drawings. The drawings are not necessarily to scale, emphasis instead being placed upon illustrating the principles of the invention.

DETAILED DESCRIPTION OF EMBODIMENTS OF THE INVENTION

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout the description of the figures.

It will be understood that when an element is referred to as being "on" another element, it can be directly on the other element or intervening elements may be present. In contrast, when an element is referred to as being "directly on" another element, there are no intervening elements present. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another. For example, a first layer could be termed a second layer, and, similarly, a second layer could be termed a first layer without departing from the teachings of the disclosure.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the figures. It will be understood that relative terms are intended to encompass different orientations of the device in addition to the orientation depicted in the figures. For example, if the device in one of the figures is turned over, elements described as being on the "lower" side of other elements would then be oriented on "upper" sides of the other elements. The exemplary term "lower," can therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein, but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Some embodiments of the invention provide MOS transistors having a recessed gate electrode and methods of fabricating the same, which can suppress the influence of a short channel effect (SCE) and a drain-induced barrier lowering (DIBL) effect and also improve swing and off current characteristics, so that the on/off operation of the MOS transistor can be effectively controlled.

Figure 1:
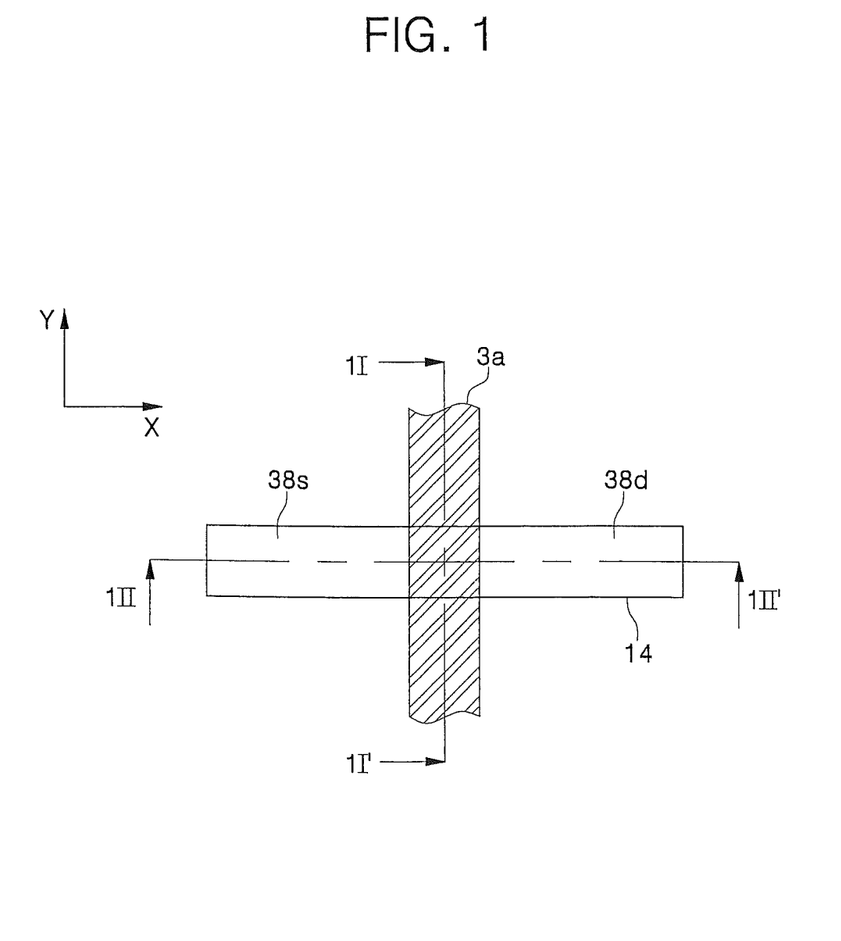
FIG. 1 is a plan view of a MOS transistor having a recessed gate electrode according to some embodiments of the present invention.
Figure 2A:
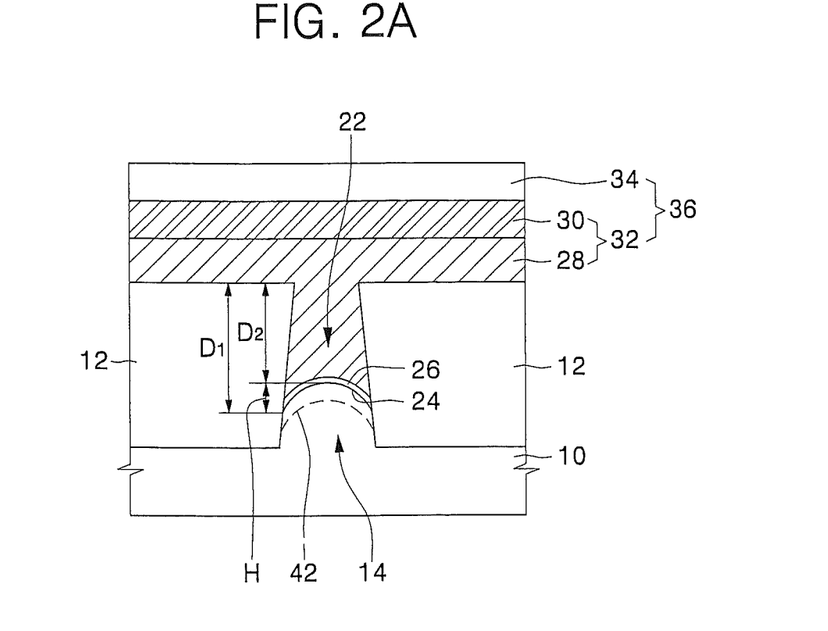
FIGS. 2A and 2B are cross-sectional views of a recessed gate electrode according to some embodiments of the present invention.
Figure 2B:
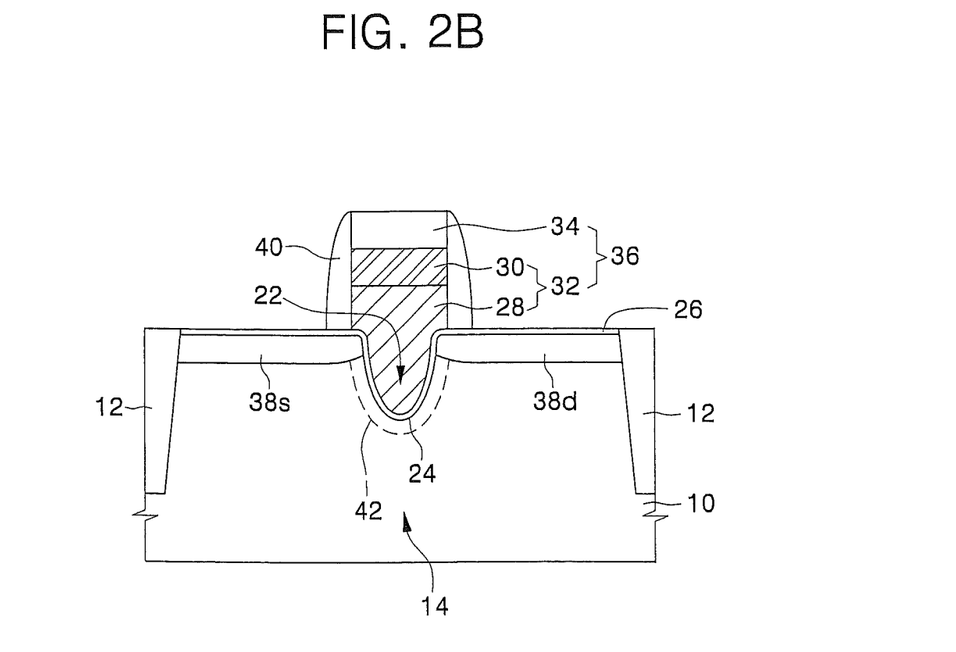
Figure 3:
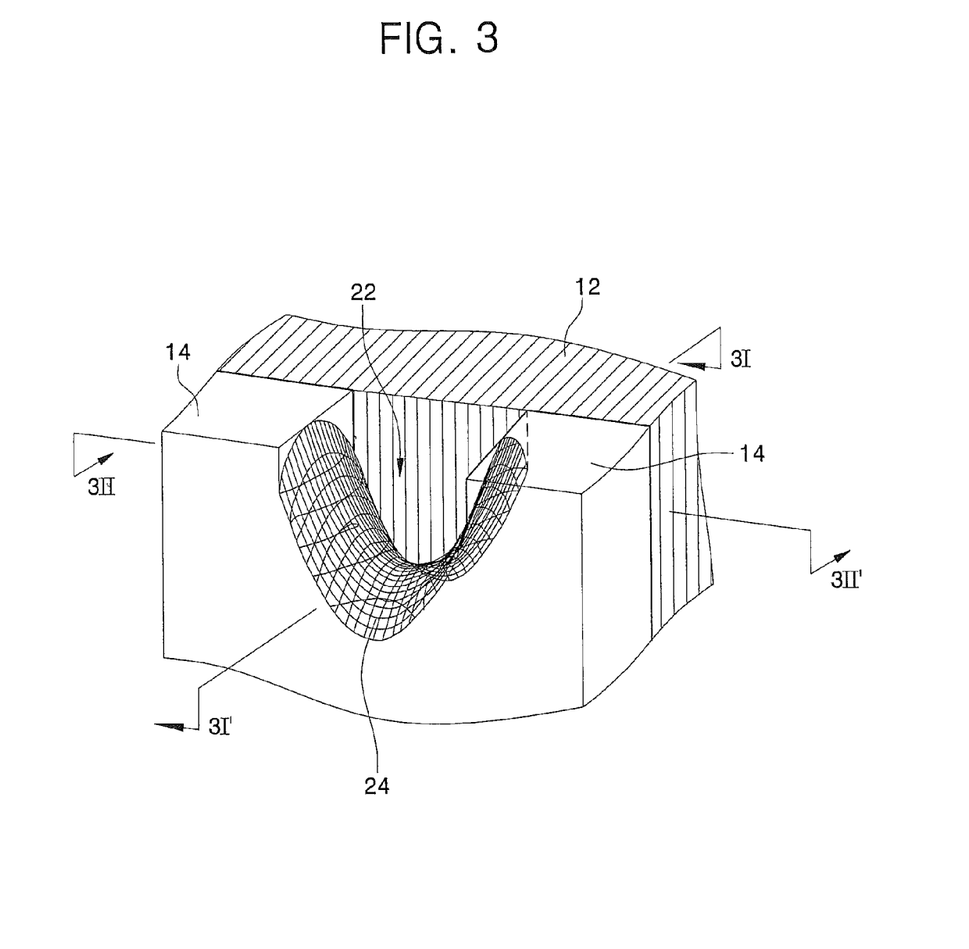
FIG. 3 is a perspective view of the channel recess shown in FIGS. 2A and 2B according to some embodiments of the present invention.

FIG. 1 is a plan view of a MOS transistor having a recessed gate electrode according to some embodiments of the present invention, and FIGS. 2A and 2B are cross-sectional views of a recessed gate electrode according to some embodiments of the present invention. In detail, FIGS. 2A and 2B are cross-sectional views taken along lines 1I-1I' and 1II-1II' of FIG. 1, respectively. Meanwhile, FIG. 3 is a perspective view of the channel recess shown in FIGS. 2A and 2B. In FIG. 3, lines 3I-3I' and 3II-3II' correspond to the lines 1I-1I' and 1II-1II' of FIG. 1, respectively.

Referring to FIGS. 1, 2A, 2B, and 3, an isolation layer 12 is disposed in a semiconductor substrate 10 to define an active region 14. The semiconductor substrate 10 may be a substrate of a first conductivity type, for example, a single crystalline silicon substrate doped with p-type impurity ions. The isolation layer 12 may be a silicon oxide layer, such as a high density plasma (HDP) oxide layer. The active region 14 may be defined as a substantially rectangular shape having a length and a width as shown in FIG. 1. However, the shape of the active region 14 is not limited to that shown in FIG. 1 as other shapes can be used in accordance with various embodiments of the present invention. A source region 38s and a drain region 38d are disposed on both sides of the active region 14. Each of the source and drain regions 38s and 38d may be a diffusion layer of a second conductivity type, for example, n-type impurity ions.

Between the source and drain regions 38s and 38d, a channel recess 22 is disposed in the active region 14. As shown in FIG. 2A, the channel recess 22 has a convex semiconductor surface 24 when viewed from a cross-sectional view taken along a second direction Y that is orthogonal to a first direction X from the source region 38s to the drain region 38d. That is, when viewed from the cross-sectional view taken along the second direction Y as shown in FIG. 2A, the channel recess 22 has a first depth D1, which is measured from the surface of the active region 14 to both ends of the active region 14 that contact the isolation layer 12, and a second depth D2, which is measured at the center between the both ends of the active region 14 and shallower than the first depth D1. Although it is illustrated in FIG. 2A that the first and second depths D1 and D2 are measured from the top surface of the isolation layer 12, the top surface of the active region 14 may be on a lower level than that of the isolation layer 12. When viewed from the cross-sectional view taken along the second direction Y, the semiconductor surface 24 is a silicon surface that looks like the bottom surface of the channel recess 22. Also, when viewed from a cross-sectional view taken along the first direction X as shown in FIG. 2B, the semiconductor surface 24 may look like the bottom surface or both bottom and side surfaces of the channel recess 22.

The semiconductor surface 24 has a projection height H that corresponds to a difference between the first and second depths D1 and D2. In this case, the projection height H may be ¼ to ½ times the width of the active region 14 taken along the second direction Y. For example, when the first depth D1 is about 150 to 200 nm and the width of the active region 14 is about 100 nm, the projection height H may be about 25 to 50 nm. Meanwhile, each of the first and second depths D1 and D2 may vary depending on a position in the first direction X. Specifically, each of the first and second depths D1 and D2 may have a minimum value at both ends of the channel recess 22 taken along the first direction X and have a maximum value at the center of the channel recess 22 taken along the first direction X. In this case, the projection height H of the semiconductor surface 24, which corresponds to the difference between the first and second depths D1 and D2, may be constant with a position in the first direction X.

As shown in FIG. 2B, when viewed from the cross-sectional view taken along the first direction X, the channel recess 22 may have substantially the shape of a letter "U" or a positive parabola. In this case, the semiconductor surface 24 may have a 3-dimensional saddle shape as shown in FIG. 3. Meanwhile, the semiconductor surface 24 may be in contact with the surface of the active region 14 at both ends of the channel recess 22 taken along the first direction X as shown in FIG. 3. However, when the channel recess 22 has a sidewall profile that is orthogonal to the surface of the active region 14, as shown in the cross-sectional view taken along the first direction X, the semiconductor surface 24 may be vertically spaced apart from the surface of the active region 14.

Referring to FIGS. 1, 2A, and 2B, a gate electrode 32, which fills the channel recess 22, is disposed across the active region 14 in the second direction Y. The gate electrode 32 may include a first conductive layer pattern 28 and a second conductive layer pattern 30. The first conductive layer pattern 28 fills the channel recess 22 and is formed to a predetermined thickness from the surface of the active region 14, and the second conductive layer pattern 30 is deposited on the first conductive layer pattern 28. In this case, the first conductive layer pattern 28 may be a polysilicon layer, and the second conductive layer pattern 30 may be a metal layer such as a tungsten layer, or a metal silicide layer such as a tungsten silicide layer, a cobalt silicide layer, and/or a nickel silicide layer. A capping layer pattern 34 may be further deposited on the gate electrode 32, and sidewalls of the gate electrode 32 and the capping layer pattern 34 may be covered by a gate spacer 40. The capping layer pattern 34 and the gate spacer 40 may comprise a silicon nitride layer. A gate insulating layer 26 is interposed between the active region 14 having the channel recess 22 and the gate electrode 32. The gate insulating layer 26 may be a silicon oxide (SiO) layer, a silicon oxynitride (SiON) layer, and/or a high-k dielectric layer. In this case, the high-k dielectric layer may be an aluminum oxide (AlO) layer, a hafnium oxide (HfO) layer, a hafnium silicon oxide (HfSiO) layer, a hafnium aluminum oxide (HfAlO) layer, a tantalum oxide (TaO) layer, a zirconium oxide (ZrO) layer, or a stacked layer thereof.

When a voltage equal to or higher than a threshold voltage is applied to the gate electrode 32, the source and drain regions 38s and 38d are electrically connected by a channel 42 that is induced in the semiconductor substrate 10 of the active region 12 along the channel recess 22. According to some embodiments of the present invention described above, the channel recess 22 is disposed in the active region 12 between the source and drain regions 38s and 38d, so that an effective channel length may be greater than that of a conventional MOS transistor having a horizontal channel. As a result, problems caused by a short channel length may be reduced or prevented. Also, the channel recess 22 includes the convex semiconductor surface 24 formed in the second direction Y (i.e., in the direction of channel width), thereby substantially increasing the channel width. This may result in an increase of a driving current that passes through the channel 42 of the MOS transistor, which may improve the operating speed of the MOS transistor. Further, according to some embodiments of the present invention, because the channel recess 22 includes the convex semiconductor surface 24 formed in the direction of channel width, the gate electrode 32 that fills the channel recess 22 surrounds in three dimensions the semiconductor surface 24 in which the channel 42 is formed. In other words, like a double gate transistor having a gate electrode that surrounds two or three sides of a channel, the gate electrode 32 surrounds the channel 42 in three dimensions. Hence, the flow of electric charges between the source and drain regions 38s and 38d may be effectively controlled by the gate electrode 32, thereby improving subthreshold characteristics, such as swing and off current. As a result, the on/off operation of the MOS transistor may be effectively controlled.

Figure 4:
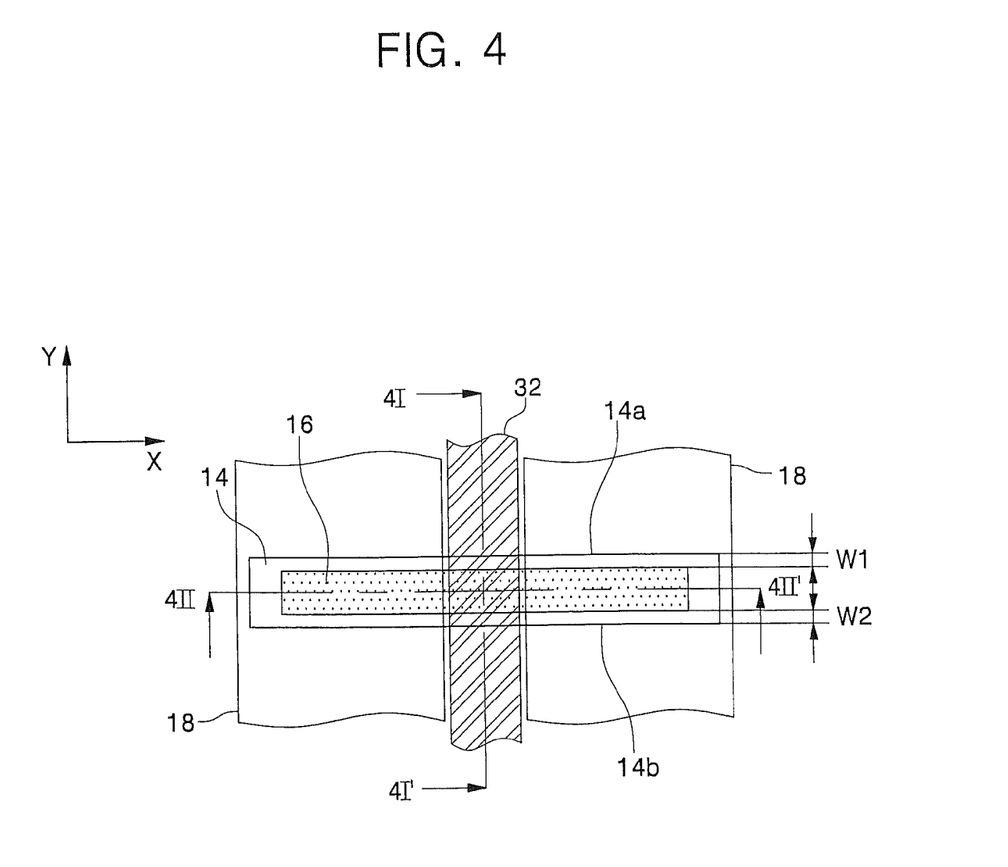
FIG. 4 is a plan view that illustrates methods of fabricating a MOS transistor having a recessed gate electrode according to some embodiments of the present invention.

FIG. 4 is a plan view illustrating methods of fabricating a MOS transistor having a recessed gate electrode according to some embodiments of the present invention, and FIGS. 5A, 5B, 6A, 6B, 7A, 7B, 8A, and 8B are cross-sectional views illustrating methods of fabricating MOS transistors having a recessed gate electrode according to some embodiments of the present invention. In detail, FIGS. 5A, 6A, 7A, and 8A are cross-sectional views taken along line 4I-4I' of FIG. 4, and FIGS. 5B, 6B, 7B, and 8B are cross-sectional views taken along line 4II-4II' of FIG. 4.

Figure 5A:
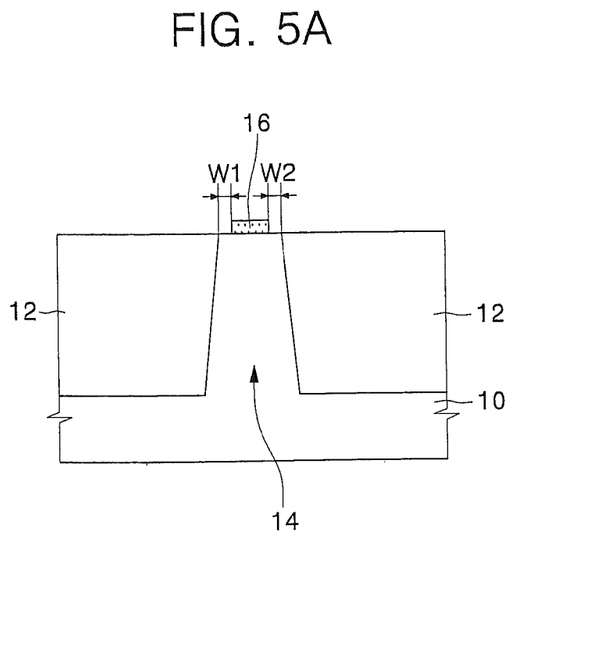
FIGS. 5A, 5B, 6A, 6B, 7A, 7B, 8A, and 8B are cross-sectional views that illustrate methods of fabricating a MOS transistor having a recessed gate electrode according to some embodiments of the present invention.
Figure 5B:
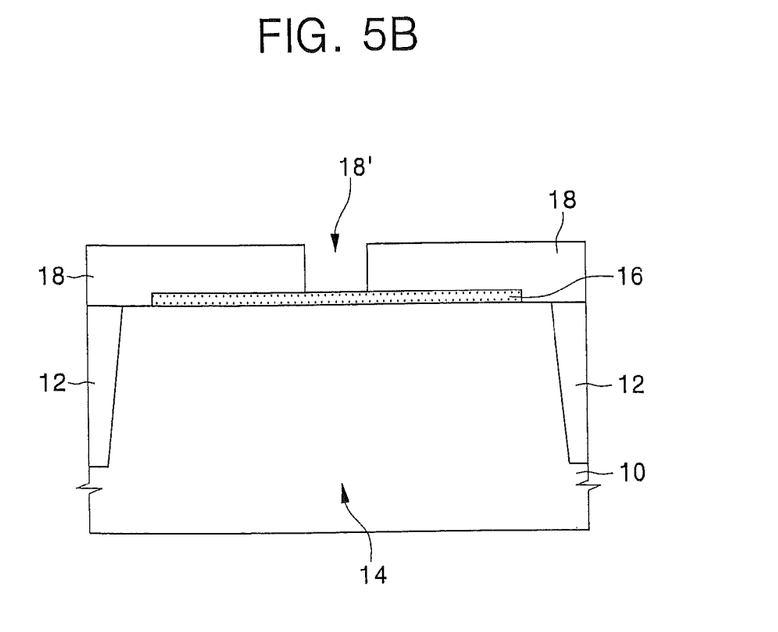

Referring to FIGS. 4, 5A, and 5B, an isolation layer 12 is formed in a semiconductor substrate 10 to define an active region 14. The semiconductor substrate 10 may be a substrate of a first conductivity type, for example, a single crystalline silicon substrate doped with p-type impurity ions. The isolation layer 12 may comprise a silicon oxide layer having a generally good gap filling characteristic, such as an HDP oxide layer, and may be obtained using shallow trench isolation (STI) techniques in accordance with various embodiments of the present invention. The active region 14 may be defined as having a substantially rectangular shape having a length and a width as shown in FIG. 4, but embodiments of the present invention are not limited to such a shape. A buffer layer pattern 16 is formed on the semiconductor substrate 10 having the isolation layer 12 such that it covers a central region of the active region 14 and exposes edge regions of the active region 14. When viewed from a plan view, the buffer layer pattern 16 is formed to expose the edge regions of the active region 14 but cover the central region of the active region 14 between the edge regions along a selected first side 14a of the active region 14 and a second side 14b opposite the first side 14a. As shown in FIG. 4, the first and second sides 14a and 14b may be both lengthwise sides of the active region 14. Hereinafter, a direction parallel to the first and second sides 14a and 14b is defined as a first direction X, whereas a direction orthogonal to the first direction X is defined as a second direction Y. The first and second directions X and Y may be length and width directions of the active region 14, respectively. In subsequent processes, a source region and a drain region will be formed on both sides of the active region 14 in the first direction X, and then a gate electrode will be formed on the active region 14 between the source and drain regions to cross the active region 14 in the second direction Y.

The buffer layer pattern 16 inhibits etching of the central region of the active region 14 during a subsequent etching process for forming a channel recess such that the central region is etched less than the edge regions. To achieve this object, the buffer layer pattern 16 may be formed of various materials. That is, the buffer layer pattern 16 may be formed of a material having an etch selectivity with respect to a silicon substrate, for example, a silicon oxide layer, a silicon nitride layer, or a polysilicon layer. Specifically, to form the buffer layer pattern 16, a buffer material layer (not shown) is formed on the surface of the semiconductor substrate 10 having the isolation layer 12. The buffer material layer may be comprise a silicon oxide layer, a silicon nitride layer, and/or a polysilicon layer as described above and may be obtained using a chemical vapor deposition (CVD) process in accordance with various embodiments of the present invention. The buffer material layer may be formed to a thickness of 100 Å or less. Thereafter, the buffer material layer is patterned using photolithography and anisotropic etching processes, thereby forming the buffer layer pattern 16. Here, the buffer layer pattern 16 may be spaced the same distance apart from both the first and second sides 14a and 14b of the active region 14. That is, as shown in FIGS. 4 and 5A, a width W1 of an edge region formed by the buffer layer pattern 16 along the first side 14a may be equal to a width W2 of another edge region formed by the buffer layer pattern 16 along the second side 14b.

Referring to FIGS. 4, 5A, and 5B, a mask pattern 18 is formed on the semiconductor substrate 10 having the buffer layer pattern 16. This mask pattern 18 includes an opening 18', which sequentially exposes a predetermined region of the buffer layer pattern 16 on the active region 14 and the edge regions of the active region 14 on both sides thereof. In other words, the mask pattern 18 covers both side portions of the active region 14 in the first direction X, but exposes the central region of the active region 14 between the both side portions, thereby sequentially exposing the predetermined region of the buffer layer pattern 16 and the edge regions of the active region 14 on both sides thereof. The mask pattern 18 may be, for example, a photoresist pattern.

Figure 6A:
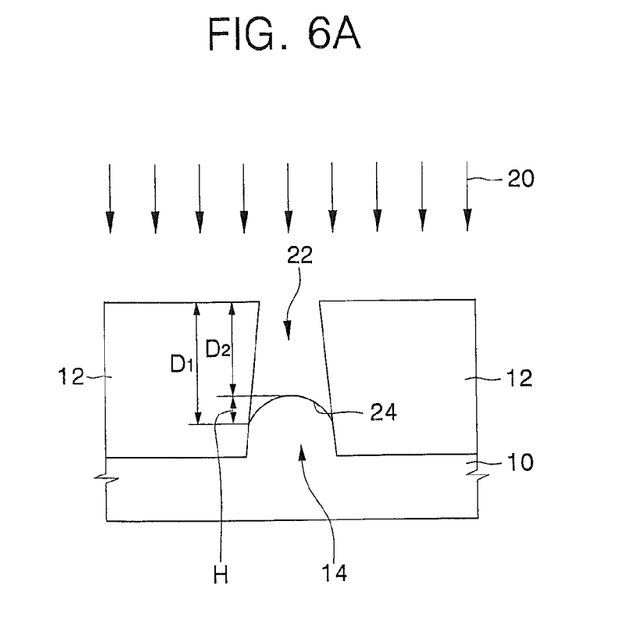
Figure 6B:
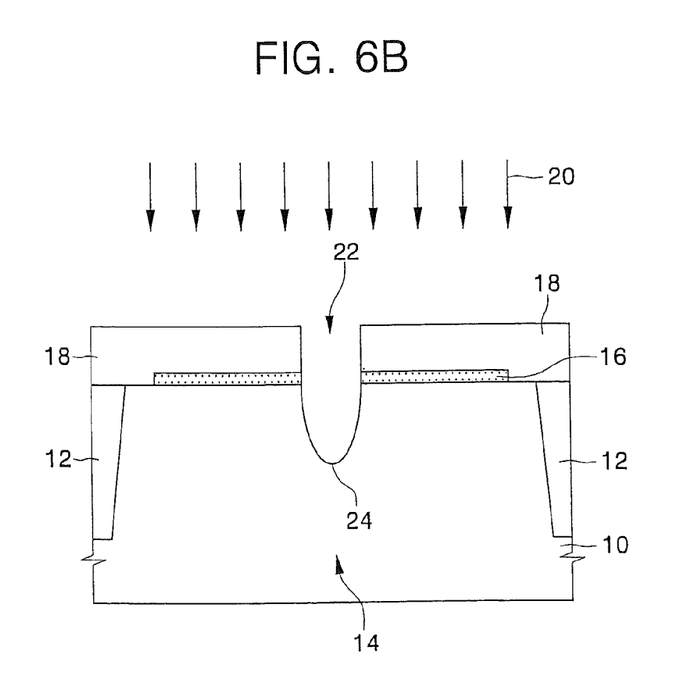

Referring to FIGS. 4, 6A, and 6B, a portion of the buffer layer pattern 16 and a portion of the active region 14, which are exposed by the mask pattern 18, are anisotropically etched using the mask pattern 18 as an etch mask (refer to 20 of FIGS. 6A and 6B). Thus, when viewed from the cross-sectional view taken along the second direction Y, a channel recess 22 having a convex semiconductor surface 24 is formed in the portion of the active region 14 exposed by the mask pattern 18. More specifically, at the outset, the portion of the buffer layer pattern 16, which is exposed by the mask pattern 18, and the edge regions of the active region 14, which are exposed by the mask pattern 18 and the buffer layer pattern 16, are etched at the same time. While the buffer layer pattern 16 is being etched, the central region of the active region 14, which is protected by the buffer layer pattern 16, is not etched. After the portion of the buffer layer pattern 16 exposed by the mask pattern 18 is removed, the central region and edge regions of the active region 14, which are exposed by the mask pattern 18, are etched at the same time. As a result, when viewed from the cross-sectional view taken along the second direction Y as shown in FIG. 6A, the channel recess 22 formed in the active region 14 has a first depth D1, which is measured at both ends of the active region 14, and a second depth D2, which is measured at the center of the active region 14 and is shallower than the first depth D1. Because the shape of the channel recess 22 formed in the active region 14 through the foregoing processes is described above with reference to FIGS. 6A and 6B, it will not be repeated here.

The buffer layer pattern 16 is etched together with the active region 14 during the anisotropic etching process 20. If the buffer layer pattern 16 is formed to a large thickness, it may act as an etch stop layer so that the channel recess 22 having the foregoing shape may not be formed. For this reason, the thickness of the buffer layer pattern 16 may be determined in consideration of the process recipe, which includes etch selectivities of the buffer layer pattern 16 and the active region 14 and an etching gas used for the anisotropic etching process 20. In this case, the buffer layer pattern 16 may be formed to a thickness of about 100 Å or less.

The anisotropic etching process 20 may be followed by an isotropic etching process. The isotropic etching process may be performed to remove silicon fences, which may remain on sidewalls of the isolation layer 12 in the second direction Y, and allow the semiconductor surface 24 of the channel recess 22 to be further rounded. The isotropic etching process may be an isotropic dry etching process or a wet etching process, which uses a solution containing $NH_4OH$ and $H_2O_2$ as an etchant.

Figure 7A:
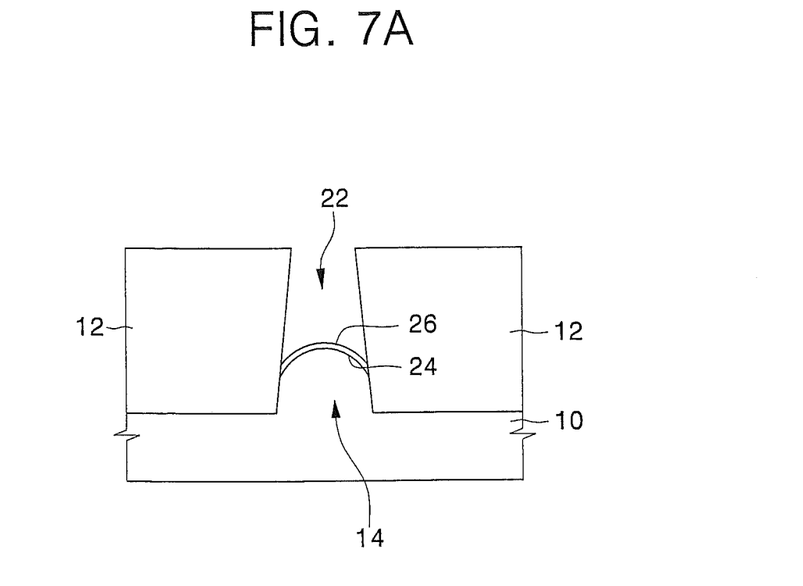
Figure 7B:
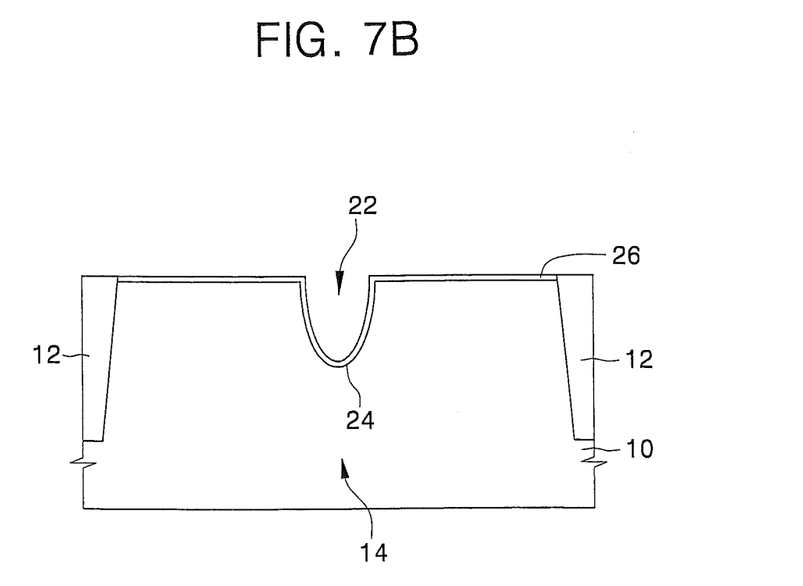

Referring to FIGS. 7A and 7B, after the channel recess 22 is formed, the mask pattern and the buffer layer pattern, which remain on the semiconductor substrate 10, are removed. If the mask pattern is a photoresist pattern, it may be removed by an ashing process using $O_2$ plasma. The buffer layer pattern may be removed by a wet etching process using an appropriate etchant. For example, when the buffer layer pattern comprises a silicon nitride layer, it may be removed using phosphoric acid ($H_3PO_4$) as an etchant. Thereafter, a gate insulating layer 26 is conformally formed to cover the active region 14 having the channel recess 22. The gate insulating layer 26 may comprise a silicon oxide layer, a silicon nitride layer, and/or a high-k dielectric layer. In this case, the high-k dielectric layer may be an aluminum oxide layer, a hafnium oxide layer, a hafnium silicon oxide layer, a hafnium aluminum oxide layer, a tantalum oxide layer, a zirconium oxide layer, or a stacked layer thereof.

Figure 8A:
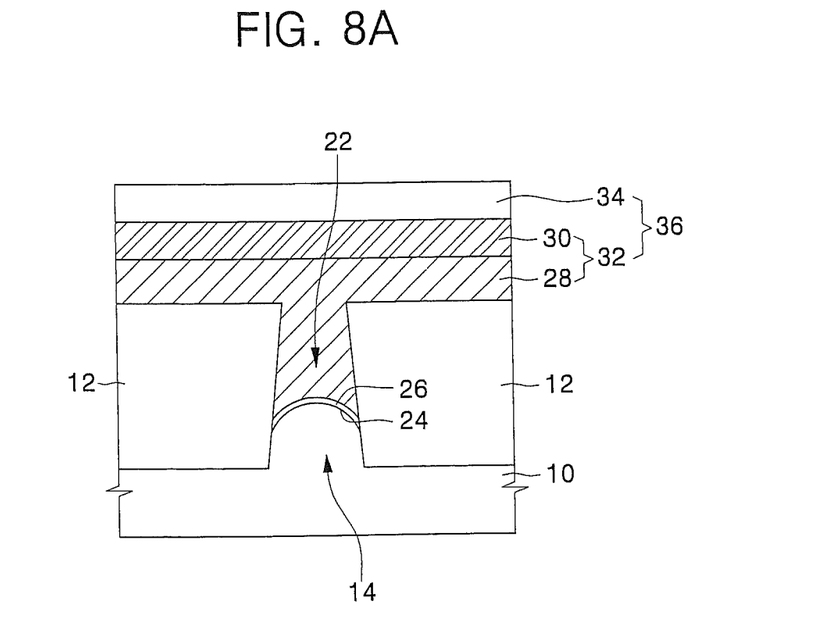
Figure 8B:
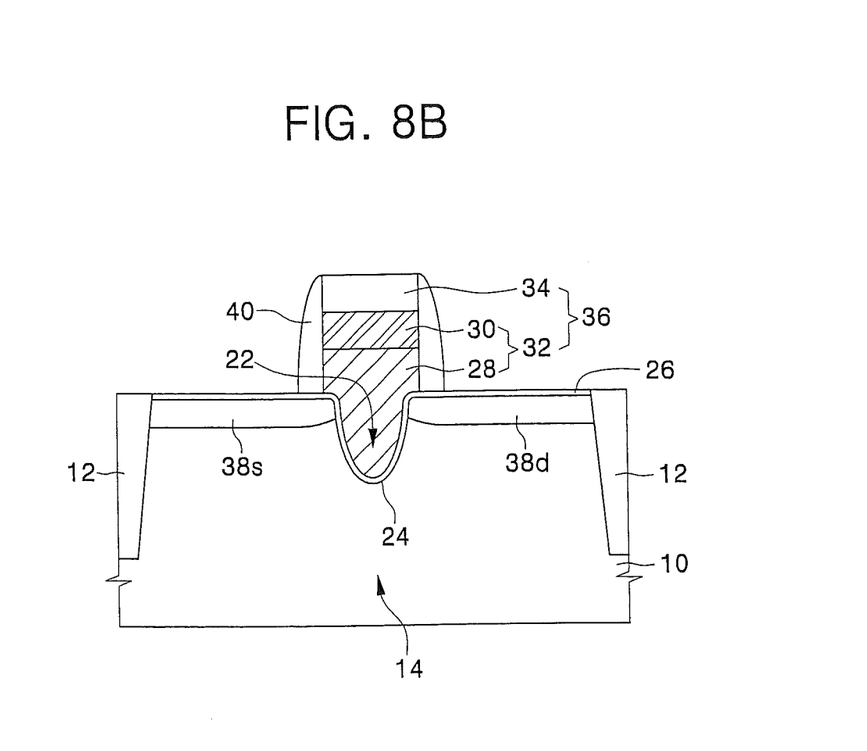

Referring to FIGS. 8A and 8B, a first conductive layer (not shown) is formed on the gate insulating layer 26 such that it fills the channel recess 22 and has a predetermined thickness from the surface of the active region 14. The first conductive layer may be planarized by a chemical mechanical polishing (CMP) process. A second conductive layer (not shown) and a capping layer (not shown) are sequentially formed on the first conductive layer. The first conductive layer may comprise a material having a generally good step coverage characteristic, for example, polysilicon. The second conductive layer may comprise a metal layer such as tungsten, or a metal silicide layer such as tungsten silicide, cobalt silicide, and/or nickel silicide. Also, the capping layer may comprise a silicon nitride layer. Subsequently, the capping layer, the second conductive layer, and the first conductive layer are sequentially patterned to form a gate pattern 36 crossing the active region 14 in the second direction Y. The gate pattern 36 includes a gate electrode 32 and a capping layer pattern 34. In this case, the gate electrode 32 includes a first conductive layer pattern 28 and a second conductive layer pattern 30, which are sequentially stacked.

Impurity ions of a second conductivity type, for example, n-type impurity ions, are implanted into the semiconductor substrate 10 using the gate pattern 36 as an ion implantation mask. Thus, a source region 38s and a drain region 38d are formed in the active region 14 on both sides of the gate pattern 36. Thereafter, a spacer insulating layer (not shown), such as a silicon nitride layer, is deposited on the entire surface of the semiconductor substrate 10 having the source and drain regions 38s and 38d and blanket etched. Thus, a gate spacer 40 is formed to cover sidewalls of the gate pattern 36.

According to some embodiments of the present invention as described above, a channel recess is formed between a source region and a drain region, and a gate electrode is formed to fill the channel recess, so that a relatively long effective channel length may be obtained in a restricted area. Also, because the channel recess includes a convex semiconductor surface in the direction of channel width, the width of a channel formed along the semiconductor surface may be substantially increased. Further, because the channel recess includes the convex semiconductor surface in the direction of channel width, the gate electrode surrounds the semiconductor surface having the channel in three dimensions. As a consequence, subthreshold characteristics, such as swing and off current, are improved to effectively control the on/off operation of the MOS transistor.

In concluding the detailed description, it should be noted that many variations and modifications can be made to the embodiments without substantially departing from the principles of the present invention. All such variations and modifications are intended to be included herein within the scope of the present invention, as set forth in the following claims.

That which is claimed:

1. A metal oxide semiconductor (MOS) transistor, comprising:
   a semiconductor substrate;
   device isolation layers disposed in the semiconductor substrate, a portion of the semiconductor substrate being disposed below an upper surface of the semiconductor substrate and having a convex surface;
   a gate electrode disposed on the portion of the semiconductor substrate having the convex surface, the gate electrode extending into the upper surface of the semiconductor substrate such that the device isolation layers extend deeper into the semiconductor substrate than the gate electrode extends into the substrate as measured from the upper surface of the semiconductor substrate; and
   a gate insulating layer disposed between the gate electrode and the portion of the semiconductor substrate.

2. The MOS transistor of claim 1, wherein the semiconductor substrate has a single first conductivity type.

3. The MOS transistor of claim 2, further comprising a source region and a drain region disposed in the semiconductor substrate on opposing sides of the gate electrode, the source region and the drain region having a second conductivity type different from the first conductivity type.

4. The MOS transistor of claim 1, wherein the gate electrode comprises a plurality of stacked conductive layers.

5. The MOS transistor of claim 1, wherein the gate insulating layer is conformally formed on the portion of the semiconductor substrate having the convex surface.

6. The MOS transistor of claim 1, further comprising a capping layer disposed on the gate electrode.

7. The MOS transistor of claim 6, wherein the capping layer is formed over the upper surface of the semiconductor substrate.

8. A metal oxide semiconductor (MOS) transistor, comprising:
   a semiconductor substrate;
   device isolation layers disposed in the semiconductor substrate so as to define an active region in the semiconductor substrate, a portion of the semiconductor substrate being disposed below an upper surface of the semiconductor substrate and having a convex surface;
   a gate electrode disposed on the active region, the gate electrode extending into a surface of the semiconductor substrate such that edges of the gate electrode extend a distance D1 into the semiconductor substrate and a portion of the gate electrode between the edges extends a distance D2 into the semiconductor substrate as measured from a surface of the semiconductor substrate where D1 is different than D2; and a gate insulating layer disposed between the gate electrode and the semiconductor substrate;

wherein the portion of the semiconductor substrate disposed below the upper surface of the semiconductor substrate has the convex surface when viewed from a cross-sectional view taken along a first direction and has a concave surface when viewed from a cross-sectional view taken along a second direction that is perpendicular to the first direction.

9. The MOS transistor of claim 8, wherein D1 is greater than D2.

10. The MOS transistor of claim 8, wherein the semiconductor substrate has a portion disposed between the device isolation layers having a convex surface.

11. The MOS transistor of claim 10, wherein the gate electrode is disposed on the portion of the semiconductor substrate having the convex surface.

12. The MOS transistor of claim 10, wherein the portion of the semiconductor substrate disposed between the device isolation layers has the convex surface when viewed from a cross-sectional view taken along a first direction and has a concave surface when viewed from a cross-sectional view taken along a second direction that is perpendicular to the first direction.

13. The MOS transistor of claim 8, wherein the gate electrode comprises a plurality of stacked conductive layers.

14. The MOS transistor of claim 8, wherein only one conductive layer of the plurality of stacked conductive layers extends into the surface of the semiconductor substrate.

15. The MOS transistor of claim 8, wherein the active region is substantially rectangular.

16. The MOS transistor of claim 8, where a difference between D1 and D2 is about ¼-½ a width of the active region.

17. The MOS transistor of claim 8, wherein the gate insulating layer is conformally formed on the active region.

18. A metal oxide semiconductor (MOS) transistor, comprising:

a semiconductor substrate;

a device isolation layer disposed in the semiconductor substrate, a portion of the semiconductor substrate being disposed below an upper surface of the semiconductor substrate and having a convex surface when viewed from a cross-sectional view taken along a first direction and has a concave surface when viewed from a cross-sectional view taken along a second direction that is perpendicular to the first direction;

a gate electrode disposed on the portion of the semiconductor substrate; and a gate insulating layer disposed between the gate electrode and the portion of the semiconductor substrate.

19. The MOS transistor of claim 18, wherein the semiconductor substrate has a single first conductivity type.

20. The MOS transistor of claim 1, wherein the portion of the semiconductor substrate disposed below the upper surface of the semiconductor substrate has the convex surface when viewed from a cross-sectional view taken along a first direction and has a concave surface when viewed from a cross-sectional view taken along a second direction that is perpendicular to the first direction.

* * * * *